United States Patent
Erlbacher et al.

(10) Patent No.: US 10,530,361 B2
(45) Date of Patent: Jan. 7, 2020

(54) ELECTRICAL CIRCUIT ARRANGEMENT WITH AN ACTIVE DISCHARGE CIRCUIT

(71) Applicant: FRAUNHOFER-GESELLSCHAFT ZUR FOERDERUNG DER ANGEWANDTEN FORSCHUNG E.V., Munich (DE)

(72) Inventors: Tobias Erlbacher, Poxdorf (DE); Stefan Matlok, Erlangen (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/011,909

(22) Filed: Jun. 19, 2018

(65) Prior Publication Data
US 2019/0007041 A1    Jan. 3, 2019

(30) Foreign Application Priority Data

Jun. 29, 2017 (DE) .................. 10 2017 211 030

(51) Int. Cl.
*H03K 17/687* (2006.01)
*H01L 49/02* (2006.01)
(Continued)

(52) U.S. Cl.
CPC ....... *H03K 17/687* (2013.01); *H01L 27/0727* (2013.01); *H01L 28/20* (2013.01);
(Continued)

(58) Field of Classification Search
CPC ............. H03K 17/687; H03K 17/6871; H03K 17/6872; H03K 17/6877
(Continued)

(56) References Cited

U.S. PATENT DOCUMENTS

| 7,592,718 B1 * | 9/2009 | Schiff ................ H03K 17/6871 307/113 |
| 2006/0244428 A1 * | 11/2006 | Jitaru ...................... H02M 1/34 323/222 |

(Continued)

FOREIGN PATENT DOCUMENTS

| JP | S60-74679 A | 4/1985 | ............. H01L 29/74 |
| JP | 2010206106 A | * 9/2010 | |

OTHER PUBLICATIONS

VomDorp et al., *Monolithic RC-Snubber for Power Electronic Applications*; IEEE PEDS 2011; Singapore, Dec. 5-8, 2011; pp. 11-14.

(Continued)

*Primary Examiner* — Adam D Houston
(74) *Attorney, Agent, or Firm* — Renner Kenner Greive Bobak Taylor & Weber

(57) ABSTRACT

The present invention relates to an electrical circuit arrangement with an active discharge circuit including at least one electrical switching element, by means of which the circuit arrangement can be discharged in controlled manner. The circuit arrangement includes a RC snubber element with capacitor and resistor for damping voltage or current peaks in the circuit arrangement, wherein the electrical switching element is integrated in the RC snubber element and connected in parallel to the capacitor of the RC snubber. This enables the discharge circuit to be designed in a manner that is economical in terms of space and cost. The discharge circuit uses the heat sink for the RC snubber element and therefore does not need any additional heat dissipation systems.

10 Claims, 4 Drawing Sheets

(51) Int. Cl.
*H01L 29/808* (2006.01)
*H01L 29/94* (2006.01)
*H01L 29/40* (2006.01)
*H01L 29/732* (2006.01)
*H01L 29/08* (2006.01)
*H01L 29/78* (2006.01)
*H01L 27/07* (2006.01)
*H01L 29/74* (2006.01)
*H02M 1/32* (2007.01)
*H02M 1/34* (2007.01)

(52) U.S. Cl.
CPC ........ *H01L 29/0821* (2013.01); *H01L 29/407* (2013.01); *H01L 29/732* (2013.01); *H01L 29/7325* (2013.01); *H01L 29/7408* (2013.01); *H01L 29/7803* (2013.01); *H01L 29/8083* (2013.01); *H01L 29/945* (2013.01); *H02M 2001/322* (2013.01); *H02M 2001/344* (2013.01)

(58) Field of Classification Search
USPC ........................................................ 327/427
See application file for complete search history.

(56) References Cited

U.S. PATENT DOCUMENTS

| | | | |
|---|---|---|---|
| 2007/0274014 A1 | 11/2007 | Berberich et al. | ........... 361/91.7 |
| 2010/0163950 A1* | 7/2010 | Gladish | ............. H01L 29/66181 |
| | | | 257/302 |
| 2012/0168839 A1* | 7/2012 | Perng | .................... H01L 25/165 |
| | | | 257/296 |
| 2015/0145104 A1* | 5/2015 | Bauer | .................. H01L 21/283 |
| | | | 257/534 |
| 2017/0287903 A1* | 10/2017 | Lui | ..................... H01L 27/0629 |
| 2017/0294859 A1* | 10/2017 | Marvin | ................... H02P 27/04 |
| 2018/0182750 A1* | 6/2018 | Burke | ................ H01L 27/0629 |
| 2019/0007041 A1* | 1/2019 | Erlbacher | ............. H01L 29/407 |

OTHER PUBLICATIONS

Kreutzer et al.; *A simple, reliable, cost and volume saving DC-link discharge device for electric vehicles*; ITEC 2015, DOI: 10.1109/ITEC.2015.7165800.

\* cited by examiner

ELECTRICAL CIRCUIT ARRANGEMENT WITH AN ACTIVE DISCHARGE CIRCUIT

TECHNICAL AREA

The present invention relates to an electrical circuit arrangement with an active discharge circuit including at least one electrical switching element, by means of which the circuit arrangement can be discharged in controlled manner.

In order to provide electrical coupling between different electrical networks, intermediate circuits are used that couple the networks electrically on an interposed current or voltage level via converters. In automotive engineering applications, it must be possible to discharge an intermediate circuit of such kind quickly for safety reasons, in the event of a malfunction or an accident. Accordingly, safety requirements have been put in place according to which the intermediate circuit of a device in the powertrain of a motor vehicle must discharge to below 60 V within 5 seconds. For this discharge, an active discharge circuit is needed via which the intermediate circuit can be discharged if necessary in controlled manner.

RELATED ART

A circuit arrangement with an active discharge circuit including at least one electric switching element via which the circuit arrangement, an intermediate circuit, can be discharged in controlled manner is known from O. Kreutzer et al., "A simple, reliable, cost and volume saving DC-link discharge device for electric vehicles", ITEC 2015, DOI: 10.1109/ITEC.2015.7165800. However, a discharge circuit of such kind takes up a corresponding amount of space, must be cooled, and must be reliably isolated.

With switching circuits in power electronics, it is known to use RC snubber elements to suppress voltage or current peaks in the switching circuit which are triggered in the switching circuit by switching processes. Such a RC snubber element is in the form of a serial circuit consisting of a capacitor and a resistor. A monolithic integrated form of such a RC snubber element is known from J. vom Dorp et al., "Monolithic RC snubber for Power Electronic Applications", IEEE PEDS 2011, pages 11 to 14. In this form, cylindrical recesses are created in a silicon substrate and are coated with an electrically isolating dielectric layer sequence containing silicon nitrite and filled with heavily doped polysilicon. The silicon substrate is rendered electrically conductive between the dielectric layer sequence and the back side by heavy doping. It is furnished with a contact metallisation on both the front side and the back side. With this design, a high capacitance of the capacitor is obtained in a small space and with very good heat dissipation.

A semiconductor structure with an integrated RC snubber element in which the switching power transistor whose voltage and/or current peaks are to be suppressed by the RC snubber element is integrated adjacent to the RC snubber element in the semiconductor substrate is also known from US 2010/0163950 A1.

The object of the present invention consists in presenting an electrical circuit arrangement with an active discharge circuit, in which the discharge circuit is integrated in the circuit arrangement at low cost and occupying little space.

SUMMARY OF THE INVENTION

The object is achieved with the electrical circuit arrangement according to patent Claim 1. Patent Claim 9 describes an electrical component according to the invention for the circuit arrangement. Advantageous variants of the circuit arrangement are subject matter of the dependent claims or may be appreciated from the following description and exemplary embodiments.

In the suggested electrical circuit arrangement, the discharge circuit includes at least one electrical switching element via which the circuit arrangement, particularly an intermediate circuit, may be discharged in controlled manner. The circuit arrangement is characterized in that it includes a RC snubber element with capacitor and resistor for suppressing voltage or current peaks in the circuit arrangement, and the electrical switching element is integrated in the RC snubber element in parallel with the capacitor of the RC snubber element.

With this integration of the least one electrical switching element of the active discharge circuit in the RC snubber element it is possible to produce a design of the discharge circuit that is economical in terms of both space and cost. The integration means that additional contacting is not required. The snubber element is designed precisely for the power class in which the discharge must also function. For applications in automotive engineering, this is currently a range between about 5 W and 100 W. An external arrangement of the discharge circuit always entails additional costs and additional space requirement, and also presents an isolation problem. The RC snubber element present in the circuit arrangement already possesses a suitable isolation and heat dissipation concept, which is then also available for use for the discharge circuit. The snubber element with integrated switching element is not occupied with discharging and damping at the same time, it only performs one function at a time. In this way, the thermal system is also used optimally for heat dissipation.

The capacitor and the resistor of the RC snubber element are integrated in a semiconductor substrate monolithically together with the at least one electrical switching element. This enables very effective heat dissipation for both subcomponents by placing the semiconductor substrate on a suitable metal body, for example. An example of this is a DCB substrate (DCB: Direct Copper Bonded).

The front side of the semiconductor substrate is particularly advantageously furnished with an arrangement of preferably via-like or cylindrical recesses coated with an electrically isolated dielectric layer or layer sequence and filled with an electrically conductive material for forming the RC snubber element. In such case, the semiconductor substrate is rendered electrically conductive in the area of the recesses between the front side and the back side by doping and has a contact metallisation on the front side and the back side. In this context, a variant may be selected such as the one described in the publication by J. vom Dorp et al. cited in the introduction, for example. The electrically conductive material and the doped semiconductor substrate with the interposed dielectric layer or layer sequence thus form the capacitor, and the region between the dielectric layer or layer sequence and the back side of the substrate forms the resistor of the RC snubber element. Then, preferably several of the electrical switching elements of the discharge circuit are distributed between the recesses and/or around the arrangement of recesses, so that upon actuation of the switching elements the capacitor, that is to say the dielectric layer or layer sequence of the capacitor, is electrically bridged. A configuration of such kind may also be provided as a separate electrical component.

The electrical switching elements may be in the form of MOSFETs, JFETs, bipolar transistors, or even thyristors.

Actuation may be effected with a suitable voltage, a suitable current, or via a fibre optic in conjunction with an optocoupler. The one or more switching elements may be dimensioned in such a way that a desired discharge current can be created in saturation operation, for example. In this way, the high heat dissipation performance of the switching element is preserved, because the thermal losses occur in the semiconductor substrate, where they can be transported away effectively. Accordingly, heat dissipation of 250 W/cm$^2$ is possible via DCB. For an intermediate circuit capacitor of 100 µF and a voltage of 800 V, for example, an (ideal) discharge current of about 15 mA is needed to discharge the capacitor to below 60 V. This leads to a peak power dissipation of about 11 to 13.3 Watt (with 900 V permanent overvoltage in the case of a malfunction). With a chip surface area of about 5 mm$^2$, the circuit would thus be stable under permanent load. In contrast, for comparable dielectric strength and chip surface area, power semiconductor components typically have an on-state resistance of <1Ω and would be destroyed by thermal effects immediately during normal switch-on.

In the preferred variant, a normally-on structure or circuit with a self-supply from the circuit arrangement is selected for the electrical switching element. In this context, the switching element is preferably actuated via only one separate connection or pin.

The suggested circuit arrangement and the suggested electrical component are usable in all applications in which a controlled discharge of a switching circuit is to be carried out. This applies for example to power modules or PCB/DCB-based power electronic systems, particularly in the form of an intermediate circuit.

BRIEF DESCRIPTION OF THE DRAWINGS

The suggested circuit arrangement and the suggested electrical component will be explained again in greater detail in exemplary terms in the following text based on embodiments thereof in conjunction with the drawing. In the drawing.

WAYS TO IMPLEMENT THE INVENTION

Figure 1:
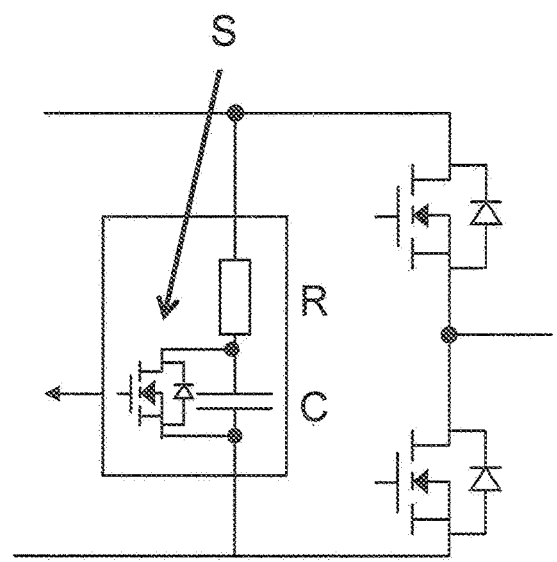
FIG. 1 shows an exemplary circuit diagram of the suggested circuit arrangement.
Figure 2:
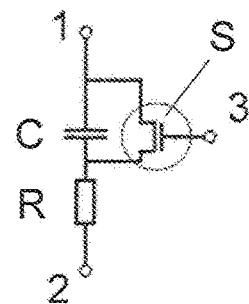
FIG. 2 is a simplified representation of the circuit diagram of a RC snubber element with the parallel connected circuit element for the following figures.

In the suggested circuit arrangement, a RC snubber element with one or more integrated switching elements is used, via which the circuit arrangement can be discharged. For this purpose, FIG. 1 shows a part of an intermediate circuit with corresponding switches, in which the voltage and/or current peaks resulting caused by the switching are damped by a RC snubber element, which is shown framed in the figure. A switching element S is integrated in this RC snubber element parallel to capacitor C. Capacitor C of the snubber element can be electrically bridged, so that the intermediate circuit can be discharged rapidly, by corresponding actuation of said switching element S, in the present example a MOSFET with a parallel-connected blocking diode. In the preferred variant, the RC snubber element and the switching element S are integrated monolithically together in a semiconductor substrate. In the following text, several examples of the creation of a RC snubber element of such kind with monolithic integrated switching element are presented. To this end, FIG. 2 first shows a highly diagrammatical circuit diagram of a RC snubber element with the integrated switching element S, the electrical connections 1, 2 for the snubber element, and the actuation connection 3 for the switch S.

Figure 3:
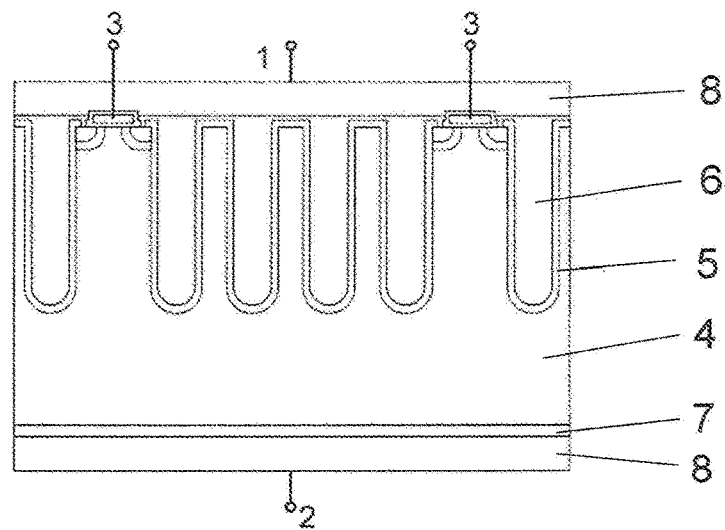
FIG. 3 is a cross-sectional representation of a first example of a version of the RC snubber element with integrated switching element.
Figure 4:
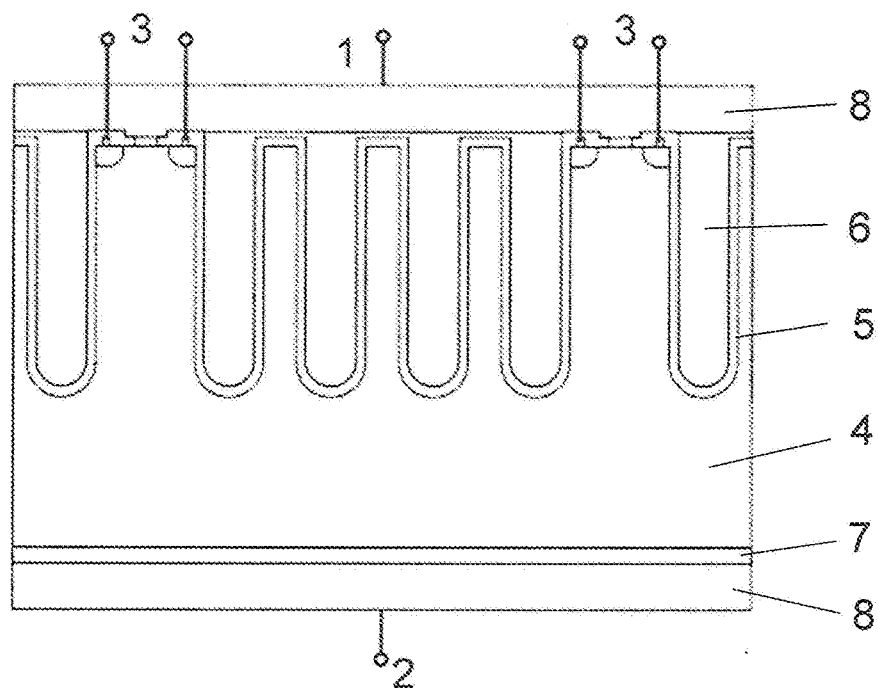
FIG. 4 is a cross-sectional representation of a second example of a version of the RC snubber element with integrated switching element.

FIG. 3 shows an example of a component structure in which the snubber element is created with a normally-on MOSFET. In this example, a Si semiconductor substrate 4 with sufficiently high doping is furnished with via-like recesses. A dielectric layer or layer sequence 5 is applied to these recesses and to the surface of the substrate. The recesses are then filled with an electrically conductive material 6 such as for example heavily doped polysilicon. The back surface of the semiconductor substrate 4 is doped more heavily still to create an electrical contact layer 7 for an ohmic contact. A metal layer 8 is then applied to both the front and back sides of the substrate 4 and is used for contacting the RC snubber element via electrical contacts 1, 2. The doped area of the semiconductor substrate 4 between the front and back surfaces also constitutes the resistor R of the snubber element. Together with the adjacent electrically conductive areas (electrically conductive filling 6, electrically conductive semiconductor substrate 4), the dielectric layer 5 forms the capacitor C of the snubber element. This is created in the same way in all the following variants. The number and dimensioning of the individual recesses is selected according to the desired value of the capacitor C. In this regard, reference is made to the publication by J. vom Dorp et al. cited in the introduction to the description, for example.

In a RC snubber element of such a design in the suggested circuit arrangement, a plurality of switching elements S are preferably arranged between the individual recesses and distributed correspondingly over the surface of the RC snubber element. FIGS. 2 to 7 show examples of two such switching elements S. In the example of FIG. 3, the circuit arrangement is created with a normally-on MOSFET. This requires more mask levels for the drain, the contact for the actuation connection 3, the gate oxide and for field oxide/isolation than in the usual manufacturing process for such a snubber element.

Instead of a MOSFET, a JFET may also be used, and this only requires additional mask levels for the drain, the contact and for field oxide/isolation. On the other hand, however, the JFET requires a negative drive voltage compared with the MOSFET. Such a design of the component structure is represented for a normally-on JFET for exemplary purposes in FIG. 4.

Figure 5:
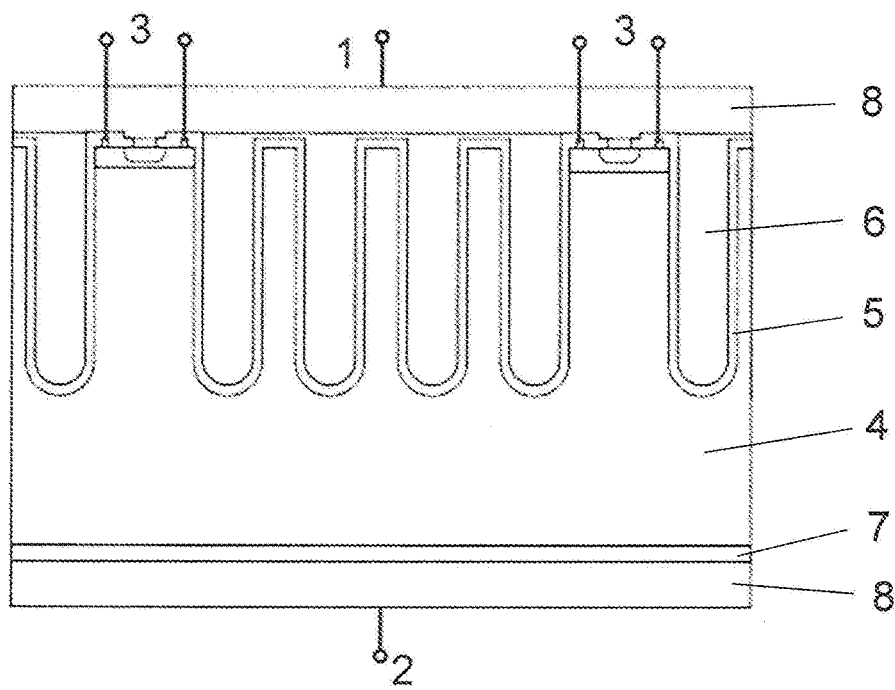
FIG. 5 is a cross-sectional representation of a third example of a version of the RC snubber element with integrated switching element.
Figure 6:
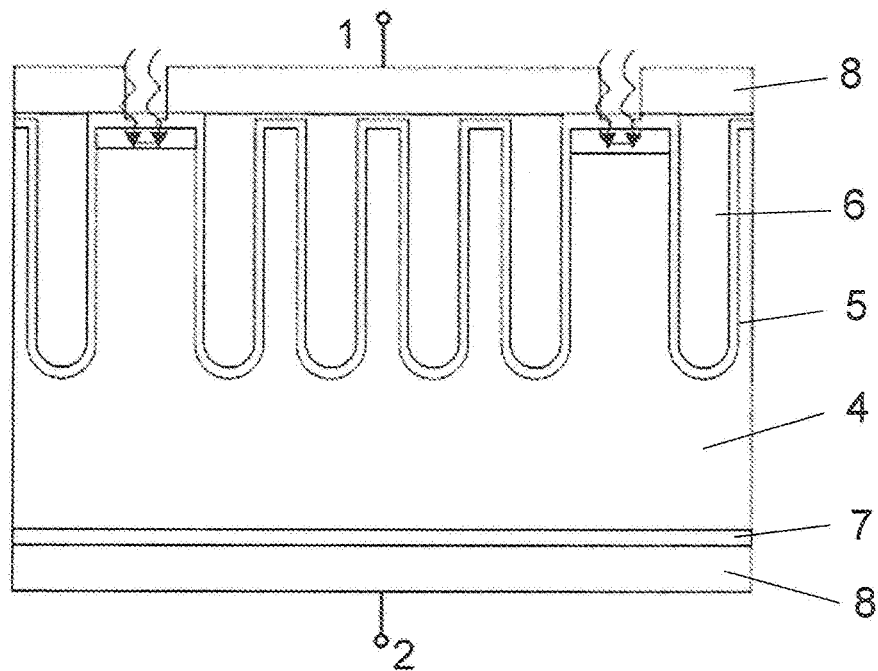
FIG. 6 is a cross-sectional representation of a fourth example of a version of the RC snubber element with integrated switching element.

The suggested circuit arrangement may also be created with a bipolar transistor as a switching element, as is shown diagrammatically in FIGS. 5 and 6. A pnp bipolar transistor requires additional mask levels for the N base, the P emitter and for field oxide/isolation. In this context, FIG. 5 shows an example of a component structure with two electrically actuated pnp bipolar transistors. FIG. 6 shows the component structure with two optically switched bipolar transistors. The incident optical radiation and the openings needed in the upper metallisation 8 for this are indicated in FIG. 6.

Figure 7:
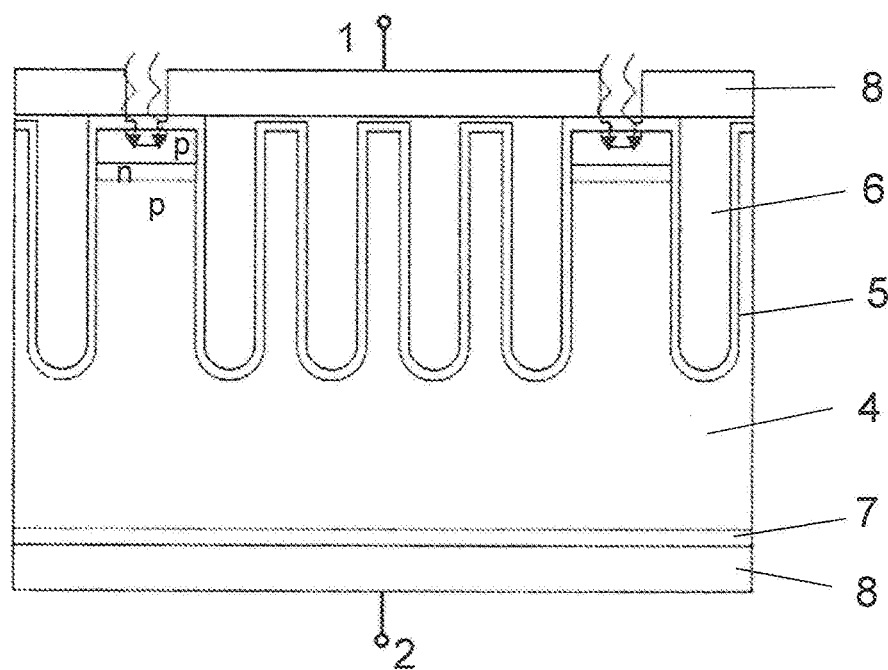
FIG. 7 is a cross-sectional representation of a fifth example of a version of the RC snubber element with integrated switching element.

The circuit arrangement may also be produced with a thyristor, which requires additional mask levels for the N base, the P base and the N emitter as well as for field oxide/isolation. For this purpose, FIG. 7 shows an example of a component structure with two optically triggered thyristors.

In principle, the circuit may be produced in various ways. For example, in one exemplary configuration, a pronounced natural dependency on the temperature may be exploited. As the temperature rises, the discharge current of the switching element should also fall. In this way, the circuit may be designed with greater intrinsic safety. If the power loss per $mm^2$ is low enough, for example below 1 W/mm$^2$ at maximum voltage, the snubber element will be operable with the discharge circuit with no risk of overload provided a sufficiently large thermal mass and/or alternative heat conduction paths are present, e.g., via the baseplate.

Figure 8:
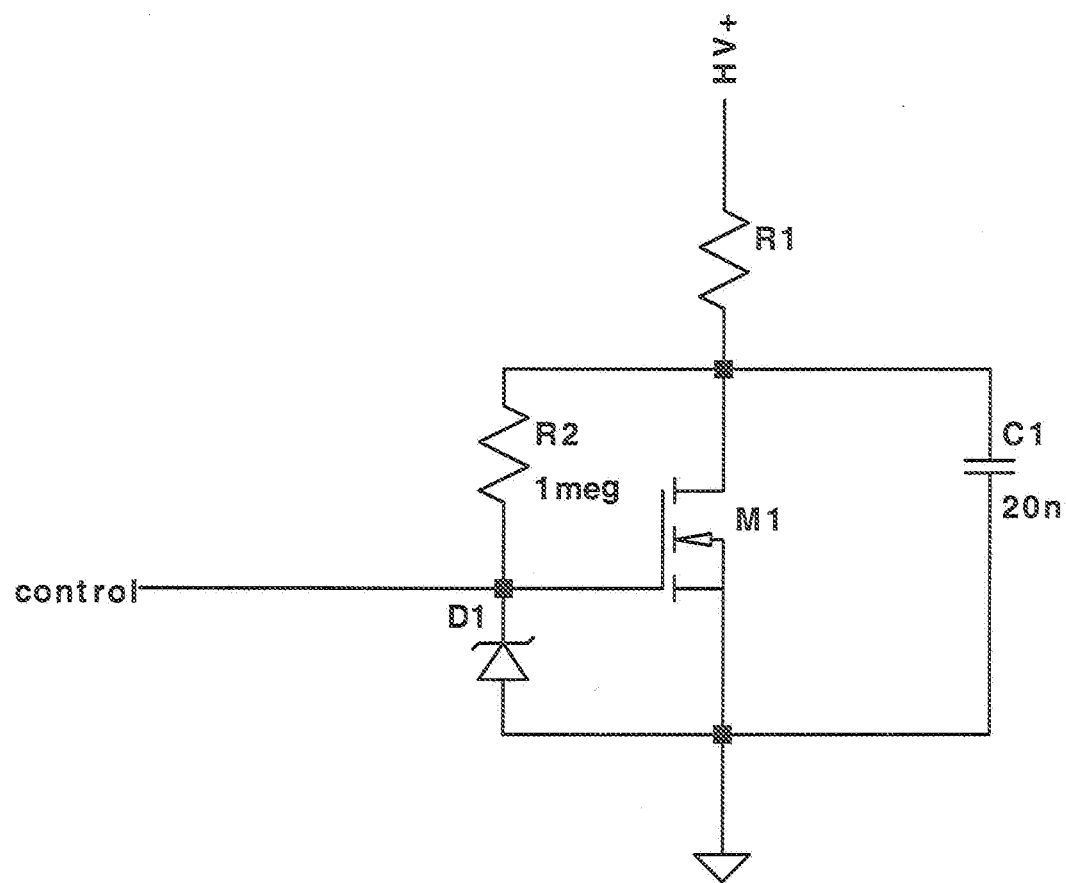
FIG. 8 is a further example of a circuit arrangement showing the RC snubber element with the integrated switching element.

In another variant, the circuit may be designed—or additional elements may also be used—to create extreme temperature dependency in the active state. Ideally, a threshold temperature results therefrom. Above this temperature, the discharge circuit exhibits very high impedance, below it has very low impedance. Thus in this variant the respective switching element functions as a power-limiting switching element in which an increase in temperature above the threshold temperature is limited by the sharp fall in the discharge current of the switching element itself. In this way, it would be possible to ensure end-to-end internally limited inherent overload safety. It is then also possible to achieve a highest rate of discharge with much lower threshold voltages. An element of such kind may thus be used for example for 400 V systems as well as for 800 V etc. FIG. 8 shows an example of a circuit for a RC snubber element of such kind with resistor R1, capacitor C1, switch M1, and in parallel to the switch a series circuit consisting consisting of a diode D1 and a further resistor R2. The losses upon discharge thus occur mainly in the switch M1 and not in the resistor R1 of the snubber element.

The discharge function may be deactivated via an external optocoupler, so that only a single pin is needed to actuate switching element M1.

With the suggested circuit arrangement, it is possible to discharge a switching circuit, particularly an intermediate circuit, distributed over the large chip surface of a RC snubber via a small, inherently safe power switch. The circuit arrangement is inherently safe and stable with regard to permanent short circuit. The rate of discharge may be influenced by the partitioning.

REFERENCE LIST

1 Upper connector for RC snubber element
2 Lower connector for RC snubber element
3 Control connector for switching element
4 Semiconductor substrate
5 Dielectric layer or layer sequence
6 Electrically conductive filling
7 Ohmic layer
8 Metallisation layer
R Resistor of the RC snubber element
C Capacitor of the RC snubber element
S Electrical switching element

The invention claimed is:

1. An electrical circuit arrangement with an active discharge circuit which includes at least one electrical switching element via which the circuit arrangement can be discharged in controlled manner,
characterized in that
the circuit arrangement includes a RC snubber element with capacitor and resistor for damping voltage or current peaks in the circuit arrangement, and the at least one electrical switching element is integrated in the RC snubber element and connected in parallel to the capacitor of the RC snubber element,
wherein the capacitor and the resistor of the RC-snubber element are integrated monolithically in a semiconductor substrate together with the at least one electrical switching element, and wherein the at least one electrical switching element is connected in such manner that it bridges the capacitor of the RC snubber for discharging the circuit arrangement.

2. The electrical circuit arrangement according to claim 1, characterized in that
a front side of the semiconductor substrate has an arrangement of recesses which are coated with an electrically isolating dielectric layer or layer sequence and filled with an electrically conductive material to form the RC snubber element, wherein the semiconductor substrate is electrically conductive by doping between the front side and a back side at least in the area of the recesses, and has a contact metallisation on the front side and the back side respectively.

3. The electrical circuit arrangement according to claim 2, characterized in that
several of the electrical switching elements are distributed between the recesses and/or around the arrangement of recesses in the semiconductor substrate.

4. The electrical circuit arrangement according to claim 1, characterized in that
the at least one electrical switching element is embodied as a MOSFET, JEST, bipolar transistor or a thyristor.

5. The electrical circuit arrangement according to claim 1, characterized in that
the at least one electrical switching element is designed such that it can be actuated via an electrical or an optical control signal to discharge the circuit arrangement.

6. The electrical circuit arrangement according to claim 1, characterized in that
the at least one electrical switching element is designed as a power-limiting switching element, in which a temperature rise above a threshold temperature limits itself by a fall in the discharge current of the switching element.

7. The electrical circuit arrangement according to claim 1, characterized in that
the circuit arrangement is designed as an intermediate circuit.

8. An electrical component for a according to claim 1, which is formed of a semiconductor substrate, the front side of which is furnished with an arrangement of recesses, wherein the front side with the recesses is coated with an electrically isolating dielectric layer or layer sequence, and the recesses are filled with an electrically conductive material, and wherein the semiconductor substrate is made electrically conductive between the front side and a back side at least in the area of the recesses with a doping and has a contact metallisation on each of the front side and the back side, characterized in that a plurality of electrical switching elements are distributed between the recesses in the semiconductor substrate and/or around the arrangement of recesses in such manner that they bridge the electrically isolating dielectric layer or layer sequence by actuation.

9. The electrical circuit arrangement according to claim 3, characterized in that the electrical switching elements are designed as power-limiting switching elements, in which a temperature rise above a threshold temperature limits itself by a fall in the discharge current of the switching elements.

10. An electrical component according to claim 8, characterized in that the electrical switching elements are designed as power-limiting switching elements, in which a temperature rise above a threshold temperature limits itself by a fall in the discharge current of the switching elements.

* * * * *

UNITED STATES PATENT AND TRADEMARK OFFICE
CERTIFICATE OF CORRECTION

PATENT NO.        : 10,530,361 B2
APPLICATION NO.   : 16/011909
DATED             : January 7, 2020
INVENTOR(S)       : Tobias Erlbacher and Stefan Matlok It is certified that error appears in the above-identified patent and that said Letters Patent is hereby corrected as shown below:

In the Claims

In Column 6, Line 42 (Claim 4, Line 4) the word "JEST" should read --JFET--.
In Column 6, Line 61 (Claim 8, Line 1) the words "An electrical component for a according to claim 1," should read --An electrical component for a circuit arrangement according to claim 1,--.

Signed and Sealed this
Eighteenth Day of February, 2020

Andrei Iancu
*Director of the United States Patent and Trademark Office*